US007180578B2

(12) United States Patent
Gout et al.

(10) Patent No.: US 7,180,578 B2
(45) Date of Patent: Feb. 20, 2007

(54) EXPOSURE ASSEMBLY FOR EXPOSING A DOUBLE-SIDED PRINTED CIRCUIT PANEL TO LIGHT

(75) Inventors: Grégoire Gout, Bihorel (FR); Christophe Cousin, Orvaux (FR)

(73) Assignee: Automa-Tech, Val de Reuil (FR)

( * ) Notice: Subject to any disclaimer, the term of this patent is extended or adjusted under 35 U.S.C. 154(b) by 88 days.

(21) Appl. No.: 10/964,636

(22) Filed: Oct. 15, 2004

(65) Prior Publication Data

US 2005/0083510 A1 Apr. 21, 2005

(30) Foreign Application Priority Data

Oct. 17, 2003 (FR) ................................. 03 12149

(51) Int. Cl.
*G03B 27/58* (2006.01)
*G03B 27/32* (2006.01)
*G03B 27/04* (2006.01)

(52) U.S. Cl. .............................. 355/72; 355/26; 355/95
(58) Field of Classification Search .................. 355/26, 355/53, 72–76, 91, 95; 310/10, 12
See application file for complete search history.

(56) References Cited

U.S. PATENT DOCUMENTS 5,627,378 A * 5/1997 Baxter ................... 250/455.11
5,995,205 A * 11/1999 Sorel et al. .................... 355/95
6,700,650 B2 * 3/2004 Sorel et al. .................... 355/91
6,806,945 B2 * 10/2004 Ise et al. ....................... 355/91

FOREIGN PATENT DOCUMENTS

FR 2 748 887 11/1997

* cited by examiner

*Primary Examiner*—Henry Hung Nguyen
(74) *Attorney, Agent, or Firm*—Cabinet Beau de Loménie

(57) ABSTRACT

An exposure assembly and an exposure installation for exposing a double-sided printed circuit panel to light through a first and a second artwork, including at least one exposure assembly having a frame, a first and a second artwork support, means for moving closer/separating for the artwork supports, and means for holding the printed circuit panel. The installation furthermore includes an optical detection device for detecting position errors, a light source, and an optical device for directing a light beam emitted by said light source.

The exposure assembly furthermore has a common displacement device making it possible to jointly displace the artwork supports, and a separate displacement device making it possible to displace the second artwork support with respect to the first artwork support.

15 Claims, 6 Drawing Sheets

EXPOSURE ASSEMBLY FOR EXPOSING A DOUBLE-SIDED PRINTED CIRCUIT PANEL TO LIGHT

The invention relates to an exposure assembly and to an exposure installation for exposing to light comprising at least one assembly for exposing a double-sided printed circuit panel through a first and a second artwork, said first and second artworks each being provided with a registration mark, comprising:
- a bed fixed in a substantially horizontal plane,
- a first and a second artwork support respectively intended to support the first and the second artwork,
- means for moving closer/separating making it possible to move the first and second artwork supports closer together and to separate them, and
- holding means for holding the printed circuit panel fixed in its plane with respect to the bed, the printed circuit panel being held between said first and second artwork supports, said printed circuit panel being provided with a positional registration marking.

BACKGROUND OF THE INVENTION

Such installations allow the production of printed circuit cards by employing an exposure step to define conducting tracks by photoetching.

The known installations have the function of exposing the printed circuit panels placed in an exposure assembly for a given time to a light source, generally an ultraviolet source so as to insolate a corresponding part of photosensitive ink or of photosensitive film previously deposited on the printed circuit. This exposure being done through artworks which define the tracks of the printed circuit, it is understood that the accuracy of positioning of the artwork with respect to the printed circuit panel has a fundamental role.

Such exposure installations and assemblies are known, making it possible to expose a double-sided printed circuit plate to light through artworks, for example such as that described in FR 2 748 887. However, the positioning of the two artworks situated on either side of the printed circuit panel is carried out independently with the aid of independent displacement means. The positioning of the artwork supports with respect to the printed circuit panel being accurately specifiable to within plus or minus 5 µm, it is necessary to use very accurate and hence very expensive displacement means for each of the two artworks.

Furthermore, to be able to make up for the errors of positioning of the artwork with respect to the printed circuit panel, it is necessary to allow a translational displacement (X, Y) along the two sides of the artwork and preferably a rotational displacement (θ) of the artwork in its plane. To do this, it is known to use means of individual displacement for each of the two artwork supports.

OBJECTS AND SUMMARY OF THE INVENTION

An aim of the invention is to allow the making of double-sided printed circuit cards in a reliable manner, while being more economical than the known installations which comprise an exposure assembly with individual displacement means for each of the two artwork supports.

This aim of the invention is achieved by the fact that this exposure assembly according to the invention comprises:
- common displacement means making it possible to jointly displace the first and second artwork supports in their plane with respect to the bed as a function of a common displacement information, and
- separate displacement means making it possible to displace the second artwork support in its plane with respect to the first artwork support as a function of a separate displacement information.

The invention also relates to an installation for exposing a double-sided printed circuit panel to light through a first and a second artwork, said first and second artworks each being provided with a registration mark, comprising:
- detection means for detecting position errors between said printed circuit panel, the first and the second artwork support, the positioning errors detected between at least the first artwork support and the printed circuit panel forming the common displacement information, and the positioning errors detected between the second artwork support and one out of the first artwork support and the printed circuit panel forming the separate displacement information, and
- means for generating and directing a light beam toward each of the first and second artwork supports.

This installation is one which comprises at least one exposure assembly as stated hereinabove.

The means for generating and directing a light beam may preferably comprise a single light source and optical means for directing the light beam emitted by said light source toward each of said first and second artwork supports or two light sources which are then situated respectively opposite the first and second artwork supports.

The quality of the tracks of the printed circuit made depends on the luminous power arriving at the artwork. It is therefore understood that, in the presence of a single light source, the exposure will preferably be done in succession toward the first and the second artwork support, so that the luminous power provided by the light source can be employed in totality for the exposure of an artwork. Provision may however be made to half the power provided by the light source so as to simultaneously insolate both artworks, in as much as the light source offers sufficient power to be distributed to both artworks and to carry out exposure under good conditions.

The printed circuit panel being fixed, good exposure of the former is carried out as soon as the first and second artwork supports are properly positioned with respect to the panel. To do this, with the displacement means according to the invention, it suffices to undertake a proper positioning of the first artwork support with respect to the printed circuit panel or with respect to the second artwork support and proper positioning of the second artwork support with respect to the printed circuit panel or with respect to the first artwork support.

In fact, the common displacement means make it possible, by jointly displacing the two artwork supports, to position the first artwork support, while the separate displacement means make it possible to position the second artwork support.

The common displacement information comprises a information regarding a relative displacement to be performed between at least the first artwork support and the printed circuit panel or between the first and second artwork supports and the printed circuit panel; while the separate displacement information comprises depending on whether the printed circuit panel is present at this stage of the positioning, a information regarding a relative displacement to be performed between the second artwork support and the first artwork support or between the second artwork support and the printed circuit panel.

Thus, the positioning of the artwork supports can be done on the one hand, for each of them with respect to the circuit panel itself (when it is present), that is to say positionings having the printed circuit panel as sole reference. The positioning of the artworks may be done on the other hand, by positioning one artwork support with respect to the other and at least one of the two artwork supports with respect to the printed circuit panel, that is to say positionings having the printed circuit panel and one of the two artwork supports as reference.

The order of these two displacements, common and separate, depends on the presence or otherwise of the printed circuit.

Specifically, according to a first operational mode, when the printed circuit panel is put in place prior to any adjustment, it is possible to perform a joint displacement in their plane, of the artwork supports so as to position a first of the two artwork supports with respect to the printed circuit panel according to a common displacement information, then an individual displacement in its plane of a second of the two artwork supports so as to position it independently with respect to the first of the two artwork supports (already positioned with respect to the panel) and/or with respect to the printed circuit panel itself according to a separate displacement information.

According to a second operational mode, when the printed circuit panel is not put in place before the adjustments, an individual displacement is carried out so as to position in its plane a first of the two artwork supports with respect to a second of the two artwork supports according to a separate displacement information, then a joint displacement in their plane of the two artwork supports is carried out so as to position the second artwork support with respect to the printed circuit panel according to a common displacement information. In the latter case, the displacement being joint, the first artwork is itself also properly positioned with respect to the printed circuit panel.

Thus, according to the operational mode adopted, the positioning displacements are made according to a separate or common displacement information, that is to say as a function of the errors detected between the artwork supports themselves or between one of the artwork supports and the printed circuit panel.

These errors may be detected with the aid of detection means provided directly on each exposure assembly and able to be borne by the latter or indeed be common to the various exposure assemblies provided in the installation. In the latter case, the detection means are fixed with respect to the light source, they are therefore not borne by the exposure assemblies.

Advantageously, the separate displacement means make it possible to displace the second artwork support in its plane with respect to the first artwork support according to the separate displacement information, in this instance as a function of the positioning errors detected between the second artwork support and the first artwork support and the common displacement means make it possible to jointly displace the first and second artwork supports in their plane with respect to the bed according to the common displacement information, in this instance as a function of the positioning errors detected between the printed circuit panel and the first and second artwork supports.

The positioning of the first artwork support being performed with respect to the second printed circuit support, it can be preserved even during changes of panels since the panels do not serve as reference for this adjustment. Furthermore, the adjustment of the artwork supports with respect to the panel is guaranteed since this adjustment is carried out by joint displacement of the two artwork supports with respect to the panel.

Thus, the first adjustment (between the artwork supports) may be carried out once only for a series of printed circuit panels, that is to say as long as the artworks are not replaced.

Advantageously, the installation comprises two exposure assemblies and displacement means making it possible to displace the two exposure assemblies with respect to one another between alternatively a printed circuit panel loading/unloading position and an exposure position.

Thus, the first aforesaid adjustment may be performed on each of the two assemblies which are used alternately in the installation.

The adjustments with respect to the printed circuit panel are for their part repeated with each change of circuit panel that is to say before each exposure.

The separate displacement means advantageously comprise motor means secured to the bed whose output is connected to the second artwork support.

Thus, the motor means cooperate with the second artwork support.

The common displacement means furthermore preferably comprise a link plate which is secured to the first artwork support and which is disposed between the second artwork support and the bed, and first means of temporary securing of the second artwork support on said link plate.

The securing means allow the common use of the motor means. Specifically, the motor means of the separate displacement means may be employed for the common displacement of the artwork supports. The number of motor means and in particular the number of motors may therefore be halved, thereby rendering the exposure assembly, and a fortiori the installation, more economical, especially since, as these motor means have to be very accurate, they are very expensive. Moreover, the temporary securing of the second artwork support on said link plate makes it possible to guarantee proper holding of the positional adjustment of the first artwork support with respect to the second artwork support.

In a similar manner, the exposure assembly furthermore preferably comprises second means of temporary securing of said link plate with respect to the bed. These second securing means make it possible to preserve the adjustment between the two artwork supports and the bed, that is to say in fact between the two artwork supports and the printed circuit panel.

The means for moving closer/separating preferably comprise at least one pivot link between the first support and the link plate allowing the first artwork support to be displaced between a positioning position in which the first artwork support is substantially parallel to the second artwork support and an separated position in which the first artwork support is not substantially parallel to the second artwork support.

Thus, the first artwork support may be moved apart by pivoting upward, so that the space available on the front of the artwork supports is larger and facilitates the loading and unloading of the printed circuit panel between the two artwork supports.

These means for moving closer/separating will be chosen judiciously so as to guarantee proper holding of the adjustment in their plane of the two artwork supports with respect to one another.

Advantageously, the means for moving closer/separating furthermore comprise retaining means making it possible to retain the first artwork support between a positioning position in which the first artwork support is substantially parallel to the second artwork support while being a first distance distant, and an exposure position in which the first artwork support is substantially parallel to the second artwork support while being a second distance distant, said second distance being substantially less than or equal to said first distance.

This moving apart of the two artwork supports while remaining parallel to one another, makes it possible to have a larger available volume between the two artwork supports and therefore allows printed circuit panels of variable thicknesses (thickness less than or equal to the maximum separation) to be put in place.

Furthermore, this separation being a maximum at the moment that the printed circuit panel is put in place, the insertion of the printed circuit panel between the two artwork supports is facilitated. In the exposure position, the upper artwork support is then lowered until a separation corresponding substantially to the thickness of the printed circuit panel.

In order to guarantee proper mutual holding of the adjustment of the artwork supports, the means for moving closer/separating preferably comprise at least one translational guidance allowing the first artwork support to be displaced substantially perpendicularly to its plane, between the positioning position and the exposure position.

Thus, the insertion of the printed circuit panel does not jeopardize the adjustment performed between the artwork supports, since the moving closer together of the artwork supports is done in a direction substantially perpendicular to their plane, while the adjustment is done in their plane.

BRIEF DESCRIPTION OF THE DRAWINGS

The invention will be properly understood and its advantages will be better apparent on reading the detailed description which follows, of an embodiment of the invention, represented by way of non limiting example.

The description refers to the appended drawings in which:

FIG. 1 diagrammatically represents an installation for exposing to light a printed circuit panel which comprises two exposure assemblies.

Figure 1:
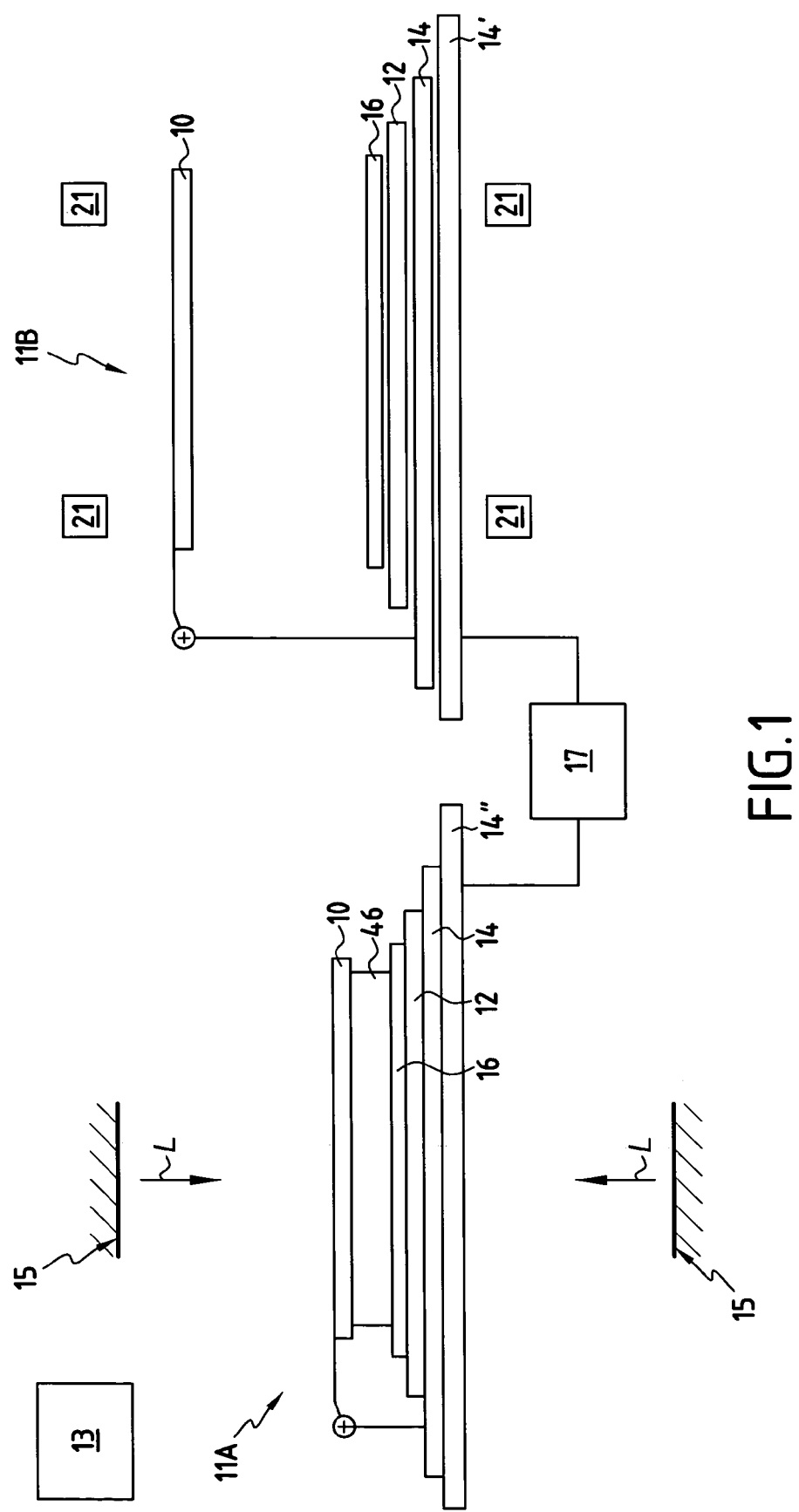
FIG. 1 represents a diagrammatic view of an installation comprising an artwork support assembly according to the invention.

A first exposure assembly 11A is put in place in the exposure position and another exposure assembly 11B is in the loading/unloading position. The installation could of course comprise other exposure assemblies in the loading/unloading position.

Each of the two exposure assemblies comprises a first artwork support 10, a second artwork support 16 disposed on a bed 14 of the exposure assembly by way of a link plate 12. Such an exposure assembly is described in greater detail in what follows.

The installation furthermore comprises a light source 13 and optical means 15 for simultaneously directing a light beam L toward each of the first 10 and second 16 artwork supports of an exposure assembly in the exposure position.

To allow the displacement of each of the exposure assemblies between the exposure position and the loading/unloading position, the installation furthermore comprises displacement means 17 of the exposure assembly. These displacement means 17 (not detailed) of known types, for example of the device with rails type, make it possible to displace an exposure assembly between the loading/unloading position in which the bed 14 of the exposure assembly is preferably held by holding means 14' and the exposure position in which the bed 14 of the exposure assembly is preferably held by holding means 14" and vice versa.

Figure 2A:
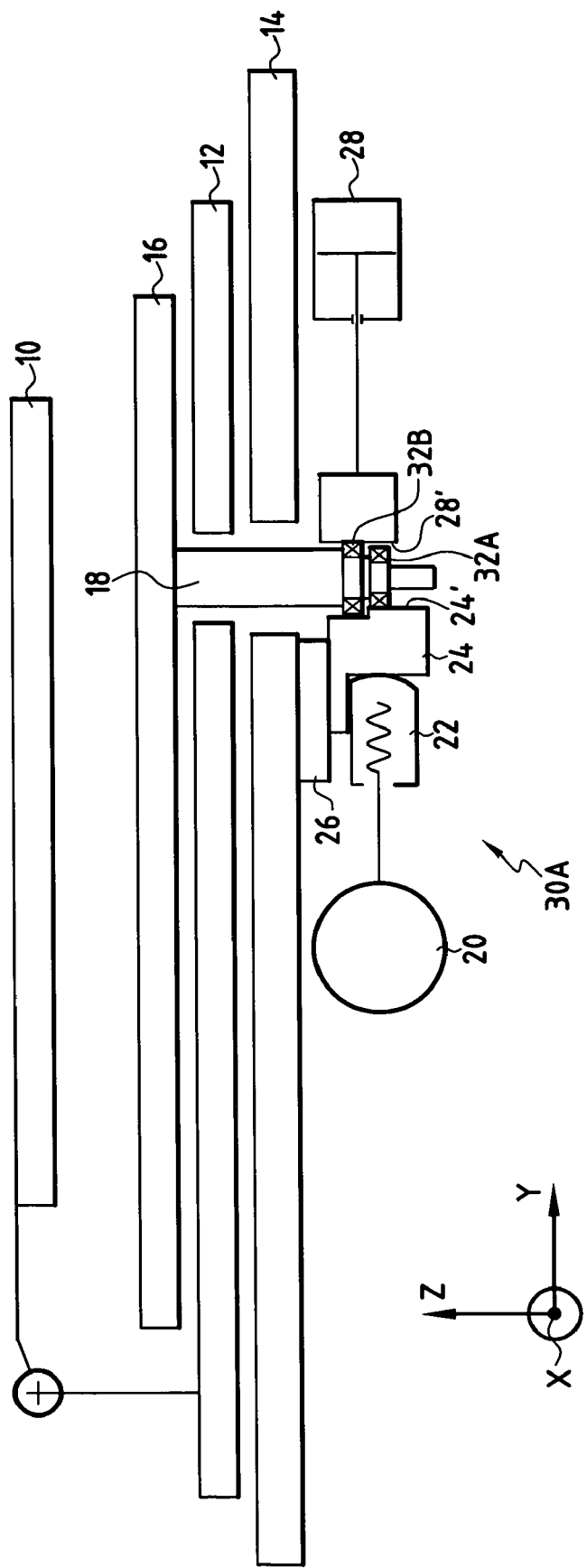
FIG. 2A represents a diagrammatic view of an artwork support assembly according to the invention.

FIG. 2A diagrammatically represents an exposure assembly according to the invention, in which the first artwork support, in this instance an upper artwork support 10 is secured to the link plate 12. This link plate 12 is disposed above the bed 14 fixed in a substantially horizontal plane (X, Y) with respect to the exposure assembly and supports the second artwork support, in this instance the lower artwork support 16. Thus, the second artwork support 16 is located below the first artwork support 10. In all that follows, the first artwork support is the upper artwork support 10, while the second artwork support is the lower artwork support 16.

In a known manner, the upper 10 and lower 16 artwork supports each comprise a rectangular metal frame on which is fixed a glass pane on which an upper, respectively lower, artwork rests.

For the description which follows, it should be understood that the displacements described relate to displacements for positioning the supports, which displacements are performed actually within an exposure assembly and which are distinct from those described previously in relation to a displacement of the assembly between its loading/unloading position and its exposure position. The displacements performed within the assembly are moreover preferably performed when the latter is located in the loading/unloading position.

To allow the displacement of the lower artwork support 16 relative to the bed 14, the exposure assembly comprises separate displacement means whose output is connected to the lower artwork support 16. In this instance, the lower artwork support 16 is connected by a motor rod 18 to motor means which comprise a motor 20 and a thrust device of screw/nut type 22. The motor means furthermore comprise a carriage 24 mounted on a runner 26 fixed to the bed 14, which makes it possible to transform with the aid of the thrust device of screw/nut type 22, the rotational motion of the motor 20 into a translational motion transmitted to the lower artwork support 16. A counter-thrust jack 28 is disposed diametrically opposite the thrust device of screw/nut type 22, with respect to the motor rod 18. This counter-thrust jack 28 makes it possible to apply a force directed opposite to that exerted by the motor and thus makes it possible to limit the play, so that the displacement of the lower artwork support 16 is substantially perfectly controlled.

In order to allow a displacement of the artwork support in all directions (longitudinal, transverse and rotational), the motor means in fact comprise three assemblies such as described previously, namely a motor rod 18, a motor 20, a thrust device of screw/nut type 22, a carriage 24, a runner 26 and a counter-thrust jack 28.

Figure 2B:
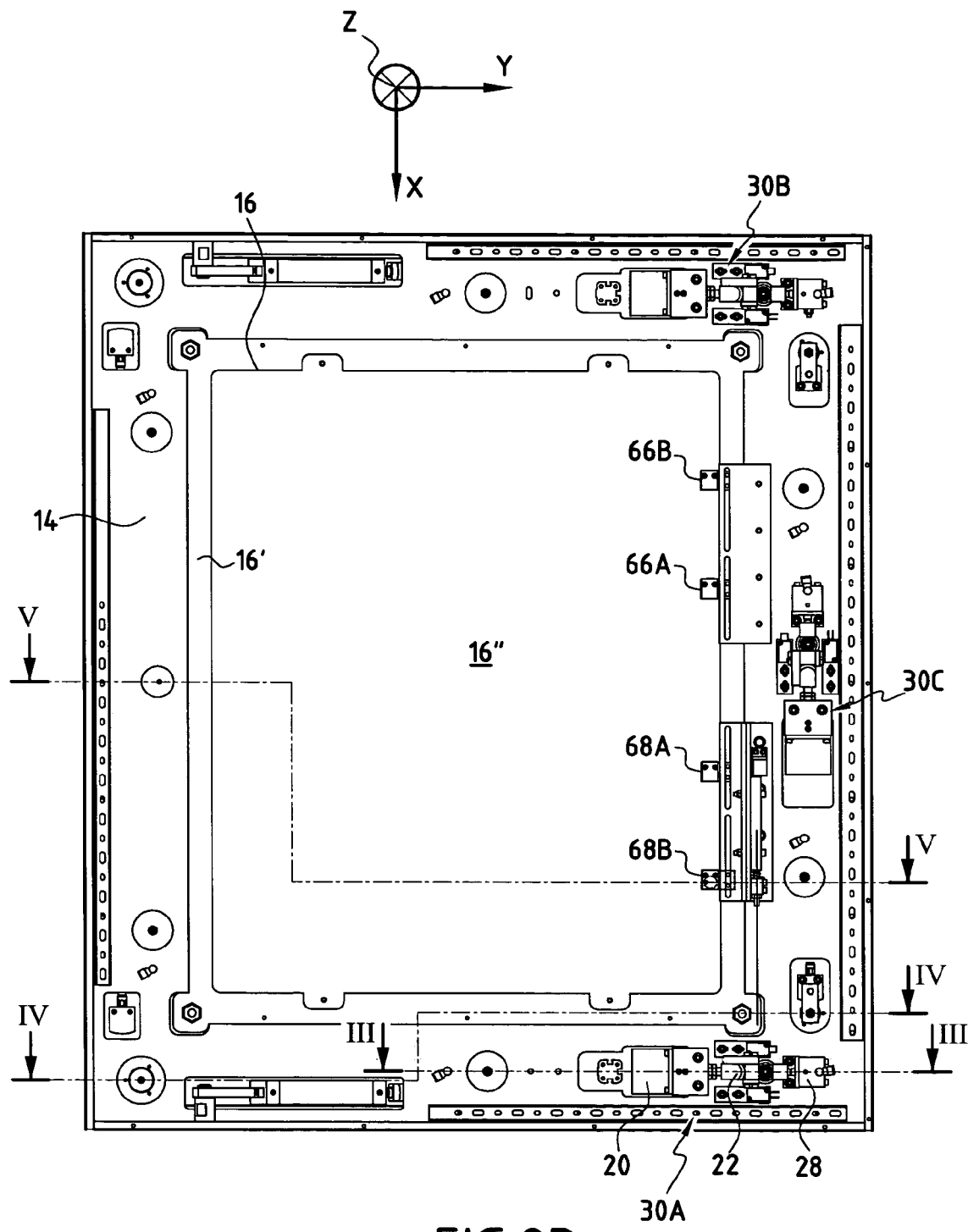
FIG. 2B represents a view from below of the exposure assembly according to the invention.

FIG. 2B illustrates the disposition of these three assemblies which may each be controlled separately. Two assemblies 30A and 30B are disposed respectively on one of the two sides of smaller length, while the third assembly 30C is disposed on one of the two adjacent sides. These three assemblies make it possible to displace the lower artwork support 16 in all directions; in this instance, the assembly 30C allows a displacement in a first direction X; an identical displacement of the two assemblies 30A and 30B allows a displacement in a second direction Y substantially perpendicular to the first direction X; and a different displacement of the two assemblies 30A and 30B allows a rotational displacement θ of the lower artwork support 16 about the substantially vertical axis Z, with as a consequence a displacement along the Y direction which needs to be compensated through a reverse motion along Y. Bearings 32A and 32B (illustrated diagrammatically in FIG. 1) cooperating respectively with the carriage 24 and the counter-thrust jack 28, permit the rotational displacements of the lower artwork support 16 with respect to the bed 14.

Figure 3:
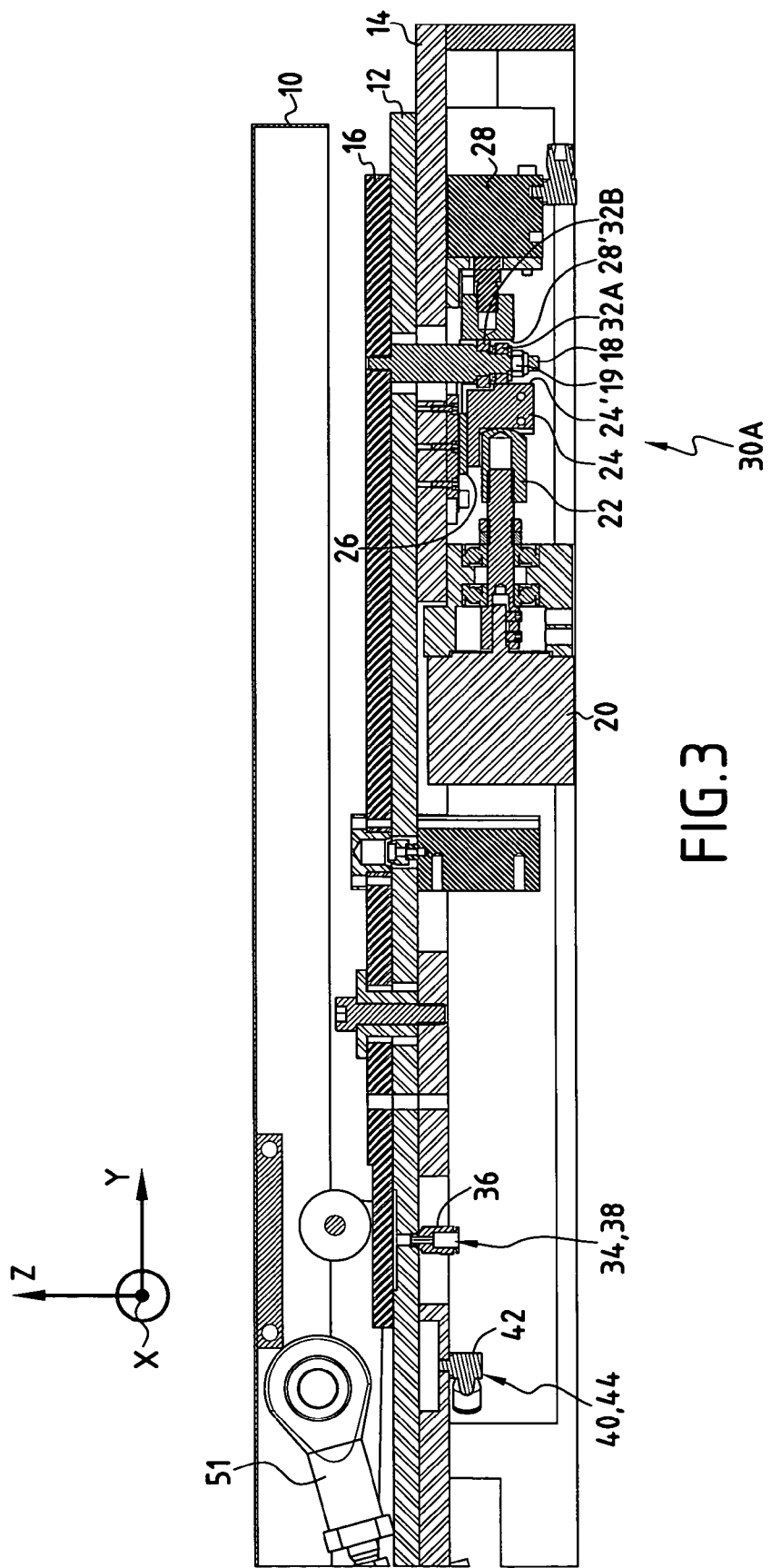
FIG. 3 represents a partial section through the exposure assembly of FIG. 2B along the line III—III.

FIG. 3 shows the exposure assembly in greater detail than in FIG. 2A. The common displacement means comprise the link plate 12 which supports the lower artwork support 16 and first means of securing 34 cooperating with said link plate 12. These securing means 34 make it possible to temporarily secure the lower artwork support 16 with the link plate 12, that is to say with the upper artwork support 10, since the latter is itself secured to the link plate 12.

These securing means 34 comprise at least one nozzle 36 connected on the one hand to the link plate 12 and on the other hand to an air suction system (not represented) which makes it possible to evacuate air between the lower artwork support 16 and the link plate 12, thus temporarily securing the two together to form just a single element. As soon as these two elements are secured, it is understood that a displacement of the lower artwork support 16 with the aid of the motor means described previously makes it possible to displace in the plane (X, Y) the assembly consisting of said lower artwork support 16 and of the plate 12 and therefore allows a joint displacement of the two artwork supports, lower 16 and upper 10.

Conversely, when air is blown into the nozzle 36, the lower artwork support 16 is held without friction, by upholding above the link plate 12. This device for blowing air into the nozzle 36 forms in this instance first means of frictionless upholding 38 of the lower artwork support 16 with respect to said link plate 12 for the separate displacement means. In fact, to hold the lower artwork support 16 in the plane (X, Y) above the link plate 12, it is preferable to have a substantially homogeneous distribution of air in the air cushion. For this purpose, several nozzles 36, in this instance six nozzles 36, are distributed over the link plate 12.

To allow this vertical displacement along the Z axis, of the lower artwork support 16 between a position in which it is supported by the link plate 12 and a position in which it is slightly upheld above the latter, the motor rod 18 is mounted so as to be vertically slideable with respect to the bed 14.

In fact, the respective inner race of the bearings 32A and 32B is mounted clamped on the motor rod 18, while their outer race is free. A nut 19 provided for the purpose, makes it possible to fasten the inner races. To bring about a displacement along the Y axis, in a first sense, the carriage 24 bears via an outer surface 24' against the outer race of the bearing 32A, whereas to obtain a displacement in the opposite sense along the Y axis, the counter-thrust jack 28 bears via an outer surface 28' against the outer race of the bearing 32B. The outer races being free, they are able to slide vertically along these two outer surfaces 24' and 28' which then form surfaces for translational guidance along the Z axis. To ensure proper translational guidance, these surfaces 24' and 28' are preferably trued.

In the same way, the common displacement means furthermore comprise second means of frictionless upholding 40 of the link plate 12 with respect to the bed 14. These means of frictionless upholding 40 comprise at least one nozzle 42 connected on the one hand to the bed 14 and on the other hand to an air blowing system (not represented) which makes it possible to blow air between the bed 14 and the link plate 12, so that the displacement of the latter in its plane (X, Y) is facilitated. Just as for the first upholding means 38, these second upholding means 40 in fact comprise several nozzles 42, in this instance six distributed over the bed 14.

Thus, it should be understood that when the first securing means 34 are not activated, a relative displacement of the lower artwork support 16 with respect to the link plate 12, but also with respect to the upper artwork support 10 and with respect to the bed 14 is possible. Conversely, when the first temporary securing means 34 are activated, the lower artwork support 16 is held fixed with respect to the link plate 12, but also with respect to the upper artwork support 10. On the other hand, its displacement with respect to the bed 14 depends on the activation of the second upholding means 40.

Specifically, while these second upholding means 40 are activated, the link plate 12 is able to be displaced with respect to the bed 14. Such is also the case for the upper artwork support 10 and the lower artwork support 16 which is connected in a temporary manner to said link plate 12.

On the other hand, when the air present between the link plate 12 and the bed 14 is sucked in with the aid of an air suction system (not represented), via the nozzle 42, forming second temporary securing means 44, the link plate 12 is held fixedly against the bed 14.

Figure 4:
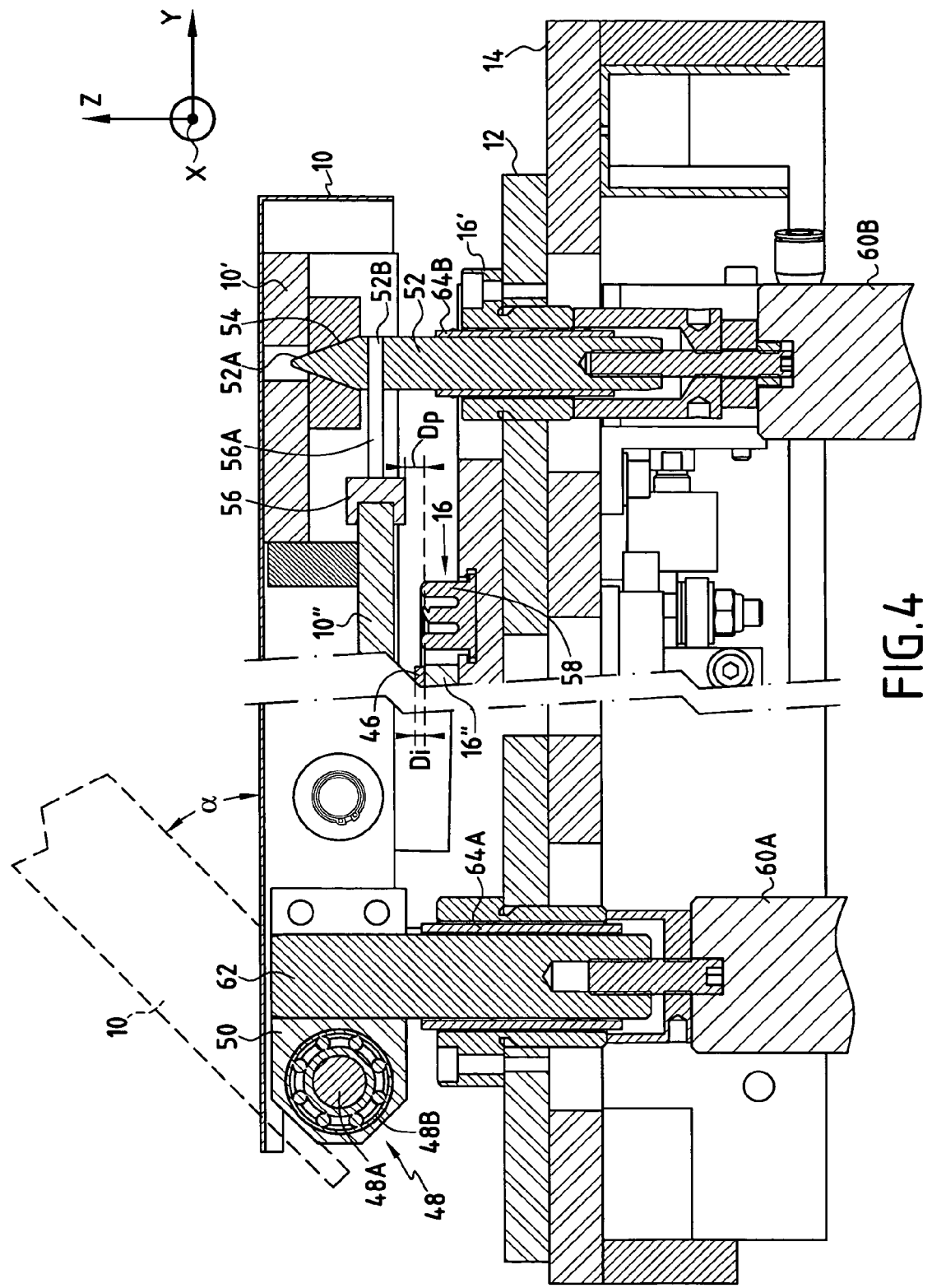
FIG. 4 represents a partial section through the exposure assembly of FIG. 2B along the line IV—IV.

With reference to FIG. 4, in order to facilitate the placing of a printed circuit panel 46 between the lower 16 and upper 10 artwork supports, in this instance by being sandwiched between the lower glass pane 16" cooperating with the lower frame 16' of the lower artwork support 16, and the upper glass pane 10" cooperating with the upper frame 10' of the upper artwork support 10, the exposure assembly comprises means for moving closer/separating making it possible to move the upper artwork support 10 closer to the lower artwork support 16 and to separate the former from the latter.

These means for moving closer/separating comprise a pivot link 48 comprising a pin 48A connected to the upper artwork support 10 and a housing 48B formed in an articulation plate 50 connected to the link plate 12. In this instance, the means for moving closer/separating comprise two pivot links 48 which are each disposed respectively on one of the two shortest sides, in the vicinity of a long side.

This pivot link 48 makes it possible to separate the upper artwork support 10 from the lower artwork support 16 by pivoting about the pin 48A. Thus, the upper artwork support 10 is moveable between a positioning position, represented by solid lines in FIG. 4, and a separated position, represented by dashed lines in FIG. 4. In the positioning position, the upper artwork support 10 is parallel to the link plate 12, hence parallel to the lower artwork support, in fact its plane lies in the plane (X, Y); this position is therefore particularly adapted to the relative displacements of the upper artwork support 10 and of the lower artwork support 16. In the separated position, the upper artwork support 10 is no longer substantially parallel to the lower artwork support 16, but angularly separated there from by an angle α greater than 0°, lying between 20° and 100°, preferably of the order of 40°.

To aid the manipulator, the means for moving closer/separating comprise at least one separating jack 51 able to facilitate the separation of the upper artwork support 10 with respect to the lower artwork support 16 between a positioning position and a separated position.

The means for moving together/separating furthermore comprise retaining means which make it possible to retain the upper artwork support 10 in its positioning position, while guaranteeing proper holding of its position independent of any separation by upward pivoting. The retaining means comprise lug means 52 cooperating with the link plate 12, in this instance two centering cones which extend substantially perpendicularly to the latter plate and which each exhibit a conical free end 52A. Each of these two centering cones 52 are disposed on the opposite side from that on which the pivot links 48 are disposed, respectively facing them.

Each of these two free ends 52A is able to penetrate a corresponding substantially conical orifice 54 in the upper artwork support 10.

The retaining means furthermore comprise pairs of retaining jacks 60A and 60B, in respective cooperation with a hinge pin 62 and the centering cone 52. The hinge pin 62 is connected in a fixed manner to the articulation plate 50, whereas it is able to slide in the link plate 12. Likewise, the centering cone 52 is able to slide in the link plate 12. Ball columns 64A and 64B may be provided so as to generate translational guidance via runner link between the pin of the hinge 62 and the centering cone 52 respectively.

These retaining jacks 60A and 60B make it possible to adapt the distance between the two artwork supports to the thickness of the printed circuit panel 46 which is substantially between 50 μm and 6 mm.

Thus, when the pairs of respective retaining jacks 60A and 60A are activated, they respectively thrust the pin of the hinge 62 and the centering cone 52 upward; it follows that the upper artwork support 10 is thrust upward according to a translation substantially perpendicular to its plane, that is to say substantially vertically, toward its positioning position. As long as the pairs of respective retaining jacks 60A and 60B are activated, the upper artwork support 10 is held in its positioning position.

As soon as the pairs of respective retaining jacks 60A and 60B are deactivated, through the very weight of the upper artwork support 10 and the activation of the vacuum draw, the pin of the hinge 62 and the centering cone 52 slide downward, bringing with them, the upper artwork support 10 according to a translation substantially perpendicular to its plane toward an exposure position in which the upper artwork support 10 is located as close as possible to the printed circuit panel 46 disposed on the lower artwork support 16.

In this exposure position, the upper artwork support 10 is located at a second distance Di less than or equal to a first distance Dp corresponding to the positioning position; the upper artwork support 10 is therefore located at a distance considered between the lower face of its glass pane 10" and the upper face of the lower glass pane 16" of the lower artwork support 16, which may vary between Dp and Di. The distance Dp at which the upper artwork support 10 is located in the positioning position is hardly greater than the customary maximum thickness of a printed circuit panel, namely of the order of 6 mm. In the case of exposure of a printed circuit panel of maximum thickness, Dp and Di are therefore substantially equal. In fact, in this case Di is hardly less than Dp on account of the vacuum draw which pulls the upper artwork support 10 hard against the printed circuit panel.

In fact, at the moment of placement of the printed circuit 46, the operator actuates the displacement of the upper support 10 into the separated position in such a way as to have a maximum of space for placing the printed circuit panel 46, then he inserts the printed circuit panel 46 between the two artwork supports so as to deposit it on holding means described herein below, then he actuates the lowering of the upper support 10 toward its positioning position in which the positioning adjustments may be performed with respect to the printed circuit panel 46. Once all the adjustments have been performed (adjustments of the two artwork supports), the operator deactivates the retaining jacks 60A and 60B, and the upper artwork support 10 lowers by downward sliding along the vertical axis Z.

The pivot link 48, just like the lug means 52 and the hinge pin 62, will be chosen judiciously, for example by being made by pairing, so as to guarantee holding of the positioning adjustments that will have been able to be performed prior to the placement of the printed circuit panel 46. Thus, when the upper artwork support 10 arrives in the positioning position from a separated position, its positioning with respect to the lower artwork support 16 is ensured.

The means for moving closer/separating make it possible to hold the horizontal positioning of the upper artwork support 10 with respect to the link plate 12, even after a displacement of the upper support 10 by pivoting.

The means for moving closer/separating furthermore comprise locking means able to lock the upper artwork support 10 with respect to the lower artwork support 16. In this instance, the locking means comprise a latching jack 56 whose rod 56A is able to penetrate a corresponding orifice 52B formed in the centering cone 52. Thus, as soon as the latching jack 56 is activated, its rod 56A penetrates the orifice 52B of the centering cone 52 and the upper artwork support is locked in the positioning position.

This locking makes it possible to set up the vacuum in the space between the upper 10 and lower 16 artwork supports, which contains the printed circuit panel 46. This vacuum makes it possible to ensure the proximity of these three elements and thus to guarantee proper making of the tracks of the printed circuit while avoiding errors of parallax during exposure. The vacuum suction is achievable, in a known manner, in this enclosure formed by the three aforesaid elements by virtue of the presence of an inflatable seal 58 which is disposed in the lower artwork support 16 and which surrounds the printed circuit panel 46. Without prior positional locking of the upper artwork support 10, the inflation of the seal 58 would tend to separate the upper artwork support 10 from the lower artwork support 16 and the vacuum suction would be ineffectual.

Figure 5:
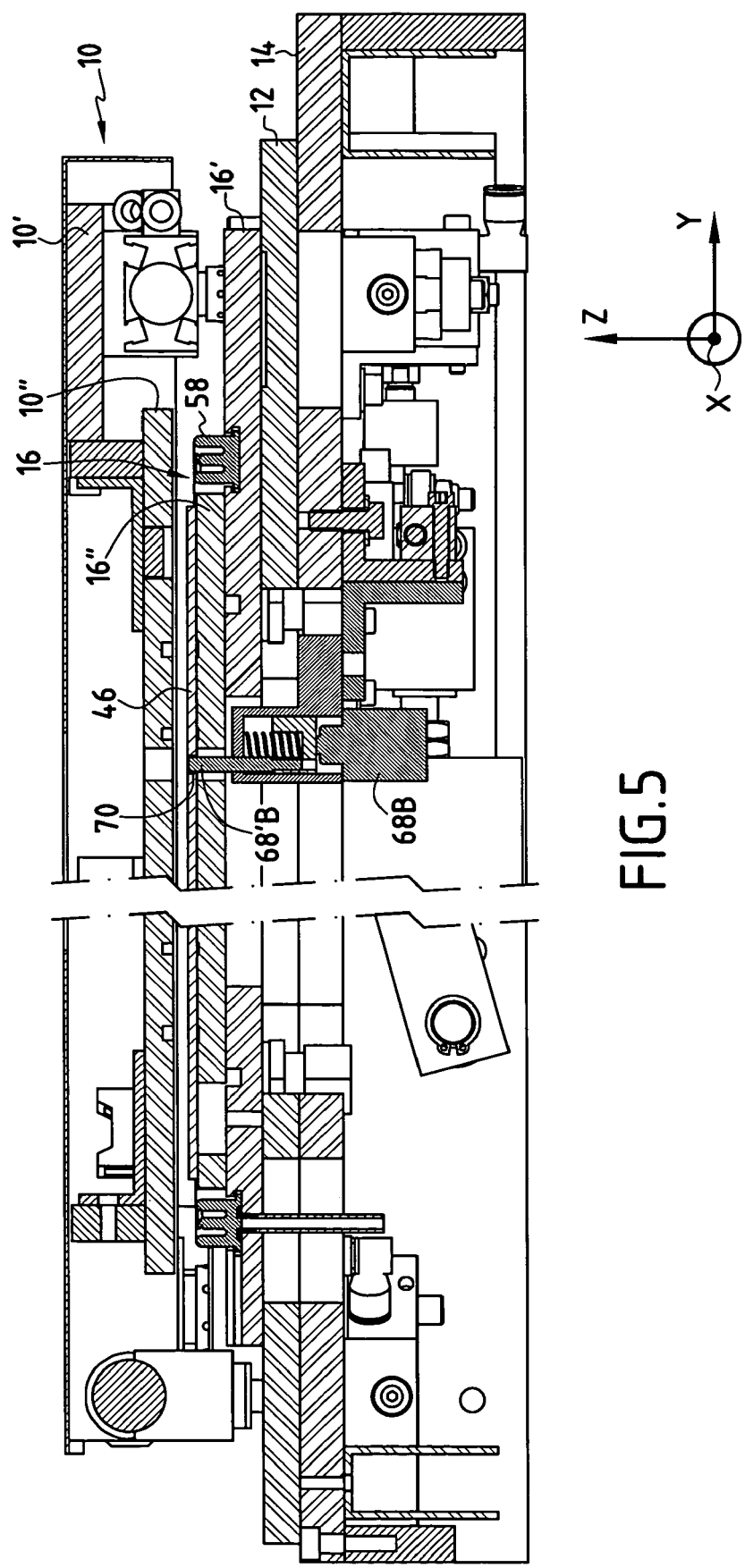
FIG. 5 represents a partial section through the exposure assembly of FIG. 2B along the line V—V.

The means for holding the printed circuit panel 46 comprise first and second means forming a centering finger which pass freely through the lower artwork support 16 (in this instance its glass pane 16") and the link plate 12, as are illustrated in FIG. 5. In fact, the holding means comprise two first means forming a centering finger, respectively 66A and 66B which are fixed with respect to the bed 14 and two second means forming a centering finger, respectively 68A and 68B. The second means forming a centering finger 68A and 68B are moveable in the horizontal plane (X, Y) with respect to the bed 14 along the X direction, as are illustrated in FIG. 2A, so as to be able to adapt their separation with respect to the first means forming a centering finger 66A and 66B, as a function of the size of the printed circuit panel to be positioned. To ensure leak tightness between the glass pane 16" of the lower artwork support and the first and second means forming a centering finger 66A, 66B, 68A, 68B, which pass through it, leak tightness means may be provided. Specifically, this leak tightness is required so as to subsequently allow a vacuum to be drawn in the space which exists between the upper 10 and lower 16 artwork supports and which contains the printed circuit panel 46.

Each of the means forming a centering finger exhibits a free end 68'B, like the second finger means 68B illustrated in FIG. 5, which is able to penetrate a corresponding registration orifice 70 made in the printed circuit panel 46. The four finger means 66A, 66B, 68A and 68B are aligned and substantially parallel to one of the sides of the lower artwork support 16.

The printed circuit panel 46 is placed on one of the pairs of fingers which is formed by one of the first means forming a centering finger, 66A or 66B and one of the second means forming a centering finger 68A or 68B according to the size of the printed circuit panel and the location of the registration orifices.

For example, when the printed circuit panel 46 is of large size, it may be disposed on the means forming a centering finger 66B and 68B. The second finger means 68A and 68B are moveable in translation so as to be able to make up for the registration holes' machining tolerance intervals.

Two operational modes both making it possible to insolate the two faces of a printed circuit panel with an installation according to the invention will now be described.

According to a first operational mode, the printed circuit panel 46 is placed by the operator on the finger means, prior to any adjustment after having brought the upper artwork support 10 into the separated position.

The operator actuates the lowering of the upper artwork support 10 toward its positioning position. The first temporary securing means 34 are activated so as to secure the lower artwork support 16 with the link plate 12, while the second temporary securing means 44 are deactivated; the second upholding means 40 are activated so as to retain the link plate 12 above the bed 14 substantially without friction.

The upper 10 and lower 16 artwork supports are then displaced jointly in their plane, that is to say substantially horizontally in the plane (X, Y), with the aid of the motor means 30A, 30B and 30C, in such a way as to position the upper artwork support 10 with respect to the printed circuit panel 46, that is to say as a function of the errors detected between the upper artwork support 10, more precisely between the upper artwork provided with a registration mark and the printed circuit panel 46 provided with a positional registration marking.

Detection means, in this instance optical detection means 21 of the type of those described in document EP 618 505 make it possible to detect the errors of positioning between the various elements constituted by the artwork supports, more precisely between the artworks, and the printed circuit panel. For this part of the installation, reference is therefore made to the description of this document which should be regarded as an integral part of the present application.

These detection means may be unique for an installation, that is to say common to the various exposure assemblies or on the contrary, be specific to each of the exposure assemblies. In the latter case, there may be provision for detection means borne by the exposure assembly and which then follow the latter during its transfer between the loading/unloading position and the exposure position.

The errors detected form the common and separate displacement informations which will make it possible to indicate to the motor means 30A, 30B and 30C the instructions for displacement along the X and/or Y axes of the various elements consisting of the upper artwork support 10 (by way of the link plate 12) and the lower artwork support 16.

Once the positioning of the upper artwork support 10 is terminated, the second temporary securing means 44 are activated so as to lock the link plate 12 and therefore the upper artwork support 10 with respect to the bed 14 and the first temporary securing means 34 are deactivated, thus freeing the lower artwork support 16. The first upholding means 38 are for their part activated to facilitate the displacement of the latter support 16.

The lower artwork support 16 is then displaced in the (X, Y) plane in an individual manner with respect to the upper artwork support 10 and therefore also with respect to the printed circuit panel 46. The positioning adjustments of this lower artwork support 16 may be done either with respect to the printed circuit panel 46 or with respect to the upper artwork support 10, since the latter is already positioned with respect to the printed circuit panel 46.

The first temporary securing means 34 are then activated so as to lock the lower artwork support 16 on the link plate 12 with respect to the bed 14 and thus secure it to the latter. The upper artwork support 10 being secured to the link plate 12, the two artwork supports and the printed circuit panel 46 are properly positioned with respect to one another. The upper artwork support 10 is then brought down toward its exposure position, the vacuum is created and the upper 10 and lower 16 artwork supports are subjected simultaneously with the aid of known optical means to an optical beam emitted by a light source (not represented).

When exposure has finished, the operator removes the printed circuit panel which has been insolated by previously bringing the upper artwork support 10 into the separated position and repeats all the aforesaid operations with a view to the exposure of another printed circuit panel.

The joint displacement for a relative positioning of the two artwork supports with respect to the printed circuit panel, as well as the separate displacement for a relative positioning of the artwork supports with respect to one another are therefore carried out before each exposure. The installation can be judiciously organized so that the operator can put in place a printed circuit panel to be insolated in spare time, that is to say while another printed circuit panel is undergoing exposure. In this case, the installer is located in the vicinity of an exposure assembly 11B in the loading/unloading position, as illustrated in FIG. 1, so as to undertake the unloading of an insolated printed circuit panel and the loading of a printed circuit panel to be insolated, while another exposure assembly 11A is undergoing exposure. As soon as the exposure of this latter exposure assembly 11A and the positioning adjustments of the exposure assembly 11B have finished, he actuates the displacement means 17 so as to reverse the position of each of the exposure assemblies 11A and 11B and so on and so forth.

According to a second operational mode, even before the printed circuit panel 46 is put in place, an individual displacement is carried out so as to position in its plane, corresponding to the horizontal plane (X, Y), the lower artwork support 16. To do this, the first upholding means 38 are activated so as to facilitate the displacement of the lower artwork support 16, while the first temporary securing means 34 are deactivated. The motor means 30A, 30B and 30C make it possible to separately displace the lower artwork support 16 with respect to the upper artwork support 10 as a function of the errors detected between the lower artwork support 16 and the upper artwork support 10, more precisely between the upper and lower artworks, with the aid of the aforesaid optical detection means. The second securing means 44 are preferably activated at the moment of the positioning of the lower artwork support 16 with respect to the upper artwork support 10, so that the upper artwork support 10 is held fixed, in this instance fixed with respect to the bed 14.

The first securing means 34 are then activated to lock the lower artwork support 16 on the link plate 12 and thus secure it to the upper artwork support 10.

The upper artwork support 10 is then brought into the separated position and the printed circuit panel 46 is put in place on the means forming a centering finger 66A and 68A or 66B and 68B. The upper artwork support 10 is then dropped down toward its positioning position.

The second securing means 44 are deactivated and the motor means 30A, 30B and 30C jointly drive the lower artwork support 16 and the upper artwork support 10 in such a way as to position the upper artwork support 10 with respect to the printed circuit panel 46 as a function of the errors detected between the printed circuit panel 46 and either the upper artwork support 10 and/or the lower artwork support 16 (more precisely the upper artwork and/or the lower artwork), these two supports already being positioned with respect to one another.

The displacement being joint and the lower artwork support 16 being positioned with respect to the upper artwork support 10, a proper positioning of the upper artwork support 10 with respect to the printed circuit panel 46 brings about a proper positioning of the lower artwork support 10 with respect to the printed circuit panel 46. In fact, the proper positioning of the two artwork supports, upper 10 and lower 16, is ensured as soon as their joint positioning is performed as a function of the errors detected between on the one hand, the printed circuit panel 46 and on the other hand, one of the two or both the upper 10 and lower 16 artwork supports (one of the two or both artworks).

The second temporary securing means 44 are then activated so as to lock the link plate 12 with respect to the bed 14 and thus secure it to the latter. The lower artwork support 16 being already locked with respect to the link plate 12, the two artwork supports and the printed circuit panel 46 are well positioned with respect to one another. The upper artwork support 10 is then brought into the exposure position by downward vertical sliding along the Z axis and the vacuum is created with a view to the exposure of the printed circuit panel through the two artworks.

When exposure has finished, the operator removes the printed circuit panel which has been insolated by previously bringing the upper artwork support 10 into the separated position and puts another printed circuit panel to be insolated in place. It is not necessary to repeat the separate displacement before the exposure of the next printed circuit panel, since the positioning of the lower artwork support 16 with respect to the upper artwork support 10 is preserved. Only the joint displacement of the artwork supports is necessarily repeated so as to realign the two artwork supports, upper 10 and lower 16 with respect to the new printed circuit panel which has just been put in place.

This second operational mode therefore offers the advantage of preserving the relative positioning of the two artwork supports with respect to one another so as to make a series of printed circuit panels. This relative positioning of the artwork supports is therefore carried out at the start of the exposure of a series of printed circuit panels, while the joint displacement for a relative positioning of the two artwork supports with respect to the printed circuit panel is carried out before each exposure. The separate displacement with all the related activations/deactivations of the aforesaid securing and upholding means not having to be carried out before each exposure, the time to make a printed circuit panel is thereby decreased, all the more if the installation is automated.

It should be noted that a check may be carried out, in this second operational mode, after each loading of a new printed circuit panel 46, to verify the holding of the adjustment of the lower 16 and upper 10 artwork supports with respect to one another. If the positioning of one of the artwork supports were no longer complied with, the latter would have to be repositioned. In this case, the positioning would be performed according to the aforesaid first operational mode, namely with respect to the printed circuit panel 46, since the latter would then be present between the two artwork supports.

The invention claimed is:

1. An assembly for exposing a double-sided printed circuit panel to light transmitted through a first artwork and a second artwork, the first and second artworks each being provided with a registration mark, the assembly comprising:
   a bed fixed in a substantially horizontal plane,
   first and second artwork supports constructed and arranged to support the first artwork and the second artwork, respectively,
   means for for moving the first and second artwork supports towards and away from each other,
   holding means for holding the printed circuit panel fixed in its plane with respect to the bed, the printed circuit panel being held between the first and second artwork supports, the printed circuit panel being provided with a positional registration marking,
   detection means for detecting position errors between the printed circuit panel and the first and the second artwork supports, wherein a detected positioning error between the printed circuit panel and at least the first artwork support is common displacement information, and wherein a detected positioning error between the second artwork support and one of the first artwork support and the printed circuit panel is separate displacement information,
   means for generating and directing a light beam toward each of the first and second artwork supports,
   common displacement means for jointly displacing the first and second artwork supports in their plane with respect to the bed in accordance with the common displacement information, and
   separate displacement means for independently displacing the second artwork support in its plane with respect to the first artwork support in accordance with the separate displacement information.

2. The exposure assembly as claimed in claim 1, wherein the separate displacement means comprises a motor disposed on the bed and connected to the second artwork support.

3. The exposure assembly as claimed in claim 2, wherein the common displacement means further comprise a link plate which is secured to the first artwork support and which is disposed between the second artwork support and the bed, and first means for temporarily securing the second artwork support on the link plate.

4. The exposure assembly as claimed in claim 3, further comprising second means for temporarily securing the link plate with respect to the bed.

5. The exposure assembly as claimed in claim 3, wherein the second artwork support is located below the first artwork support, wherein the separate displacement means comprise first means for frictionlessly upholding the second artwork support with respect to the link plate and the common displacement means comprise second means for frictionlessly upholding the link plate with respect to the bed.

6. The exposure assembly as claimed in claim 3, wherein the means for moving the first and second artwork supports comprise at least one pivot link between the first artwork support and the link plate allowing the first artwork support to be displaced between a positioning position in which the first artwork support is substantially parallel to the second artwork support, and a separated position in which the first artwork support is not substantially parallel to the second artwork support.

7. The exposure assembly as claimed in claim 1, wherein the means for moving the first and second artwork supports comprise retaining means for retaining the first artwork support between a positioning position in which the first artwork support is substantially parallel to the second artwork support at a first distance, and an exposure position in which the first artwork support is substantially parallel to the second artwork support at a second distance, the second distance being less than or equal to the first distance.

8. The exposure assembly as claimed in claim 7, wherein the means for moving the first and second artwork supports comprise at least one translational guide constructed and arranged to allow the first artwork support to be displaced substantially perpendicularly to its plane, between the positioning position and the exposure position.

9. The exposure assembly as claimed in claim 7, wherein the retaining means comprise lug means for engaging a corresponding orifice in the first artwork support when the first artwork support arrives in the positioning position from a separated position in which the first artwork support is not substantially parallel to the second artwork support, the lug means having a free end for selectively engaging the corresponding orifice in the first artwork support.

10. The exposure assembly as claimed in claim 9, wherein the means for moving the first and second artwork supoorts comprise locking means for locking the first artwork support with respect to the second artwork support.

11. The exposure assembly as claimed in claim 3, wherein the holding means comprises first and second centering fingers which pass freely through the second artwork support and the link plate and which each have a free end constructed and arranged to selectively penetrate a corresponding registration orifice in the printed circuit panel.

12. The exposure assembly as claimed in claim 1, wherein the detection means comprise optical detection means.

13. The exposure assembly as claimed in claim 1, wherein the means for generating and directing a light beam comprise a light source and optical means for directing the light beam emitted by the light source toward each of the first and second artwork supports.

14. The exposure assembly as claimed in claim 1, wherein the means for generating and directing a light beam comprise two light sources situated opposite the first and second artwork supports, respectively.

15. An apparatus comprising:
two exposure assemblies for exposing a double-sided printed circuit panel to light through first and second artworks, the first and second artworks each having a registration mark, each exposure assembly comprising:
a bed fixed in a substantially horizontal plane,
a first and second artwork supports respectively for supporting the first and second artworks, respectively,
means for moving the first and second artwork supports towards and away from each other,
holding means for holding the printed circuit panel fixed in its plane with respect to the bed, the printed circuit panel being held between the first and second artwork supports, the printed circuit panel having a positional registration marking,
common displacement means for jointly displacing the first and second artwork supports in their plane with respect to the bed according to common displacement information,
separate displacement means for displacing the second artwork support in its plane independently with respect to the first artwork support according to separate displacement information, and
exposure assembly displacement means for displacing the two exposure assemblies with respect to one another between a printed circuit panel loading/unloading position and an exposure position;
detection means for detecting position errors between the printed circuit panel and the first and second artwork supoorts, wherein a detected positioning error between the printed circuit panel and at least the first artwork support is the common displacement information, and wherein a detected positioning error between the second artwork support and one of the first artwork suppport and the printed circuit panel is the separate displacement information, and
means for generating and directing a light beam toward each of the first and second artwork supports.

* * * * *